United States Patent
Yamashima (10) Patent No.: US 11,553,628 B2
(45) Date of Patent: Jan. 10, 2023

(54) POWER CONVERSION APPARATUS, AND METHOD OF MANUFACTURING POWER CONVERSION APPARATUS

(71) Applicant: Panasonic Intellectual Property Management Co., Ltd., Osaka (JP)

(72) Inventor: Atsushi Yamashima, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 168 days.

(21) Appl. No.: 17/111,935

(22) Filed: Dec. 4, 2020

(65) Prior Publication Data

US 2021/0183735 A1 Jun. 17, 2021

(30) Foreign Application Priority Data

Dec. 12, 2019 (JP) .............................. JP2019-224459

(51) Int. Cl.
  *H05K 7/20* (2006.01)
  *H01F 27/08* (2006.01)
  *H01L 23/367* (2006.01)
  *H02M 1/32* (2007.01)

(52) U.S. Cl.
  CPC ........... *H05K 7/209* (2013.01); *H01F 27/085* (2013.01); *H01L 23/367* (2013.01); *H02M 1/327* (2021.05)

(58) Field of Classification Search
  CPC ...... H01F 27/025; H01F 27/08; H01F 27/085; H01F 27/22; H01F 27/2876; H05K 7/20854; H05K 7/209
  See application file for complete search history.

(56) References Cited

U.S. PATENT DOCUMENTS

| | | | | |
|---|---|---|---|---|
| 4,707,726 A | * | 11/1987 | Tinder | H01L 23/4093 257/796 |
| 4,972,294 A | * | 11/1990 | Moses, Jr. | H01L 23/4093 174/16.3 |
| 5,309,979 A | * | 5/1994 | Brauer | H01L 23/4093 174/16.3 |
| 5,313,701 A | * | 5/1994 | Klinger | H05K 7/20854 324/555 |

(Continued)

FOREIGN PATENT DOCUMENTS

| | | | | |
|---|---|---|---|---|
| CN | | 113555190 B | * 7/2022 | |
| DE | 102008048977 A1 | * 4/2010 | | H01F 27/025 |

(Continued)

*Primary Examiner* — Robert J Hoffberg
(74) *Attorney, Agent, or Firm* — Seed IP Law Group LLP (57) ABSTRACT

A power conversion apparatus includes a case having a heat-dissipation property, and including a housing part formed to surround a predetermined space, a resin material having a thermal conductivity, the resin material being provided in the predetermined space, a coil disposed in the predetermined space, a coil case having a shape that fits with the housing part, the coil case being configured to house the coil, and a power semiconductor device disposed along a side wall of the coil case. The power semiconductor device is pressed and fixed between a side wall of the housing part and the side wall of the coil case in a state where a heat dissipation surface is in contact with the side wall of the housing part.

10 Claims, 10 Drawing Sheets

(56) References Cited

U.S. PATENT DOCUMENTS

| | | | | |
|---|---|---|---|---|
| 6,549,409 | B1 * | 4/2003 | Saxelby, Jr. | H05K 1/0203 |
| | | | | 174/548 |
| 8,164,406 | B2 * | 4/2012 | Lin | H01F 27/2866 |
| | | | | 336/232 |
| 9,578,790 | B2 * | 2/2017 | Kodama | B60L 3/003 |
| 10,624,244 | B2 * | 4/2020 | Theander | H01L 25/18 |
| 10,917,999 | B2 * | 2/2021 | Huang | H05K 7/20327 |
| 11,195,648 | B2 * | 12/2021 | Fukuchi | H05K 7/20145 |
| 11,330,742 | B2 * | 5/2022 | Yamashima | H05K 7/20509 |
| 2015/0170817 | A1 * | 6/2015 | Yamashima | H01F 27/008 |
| | | | | 336/61 |
| 2022/0061186 | A1 * | 2/2022 | Kimura | H01L 23/3677 |

FOREIGN PATENT DOCUMENTS

| | | | | |
|---|---|---|---|---|
| EP | 2840580 A1 | * | 2/2015 | H01F 27/025 |
| JP | H01100488 U | * | 7/1989 | |
| JP | H0268415 U | * | 5/1990 | |
| JP | 2017-108007 A | | 6/2017 | |
| JP | 2017108007 A | * | 6/2017 | H01L 23/40 |
| JP | 2019-029485 A | | 2/2019 | |

* cited by examiner

POWER CONVERSION APPARATUS, AND METHOD OF MANUFACTURING POWER CONVERSION APPARATUS

TECHNICAL FIELD

The present disclosure relates to a power conversion apparatus, and a method of manufacturing the power conversion apparatus.

BACKGROUND ART

Conventionally, power conversion apparatuses such as a charger and an inverter are known.

In general, in power conversion apparatuses of the above-mentioned type, it is desirable to deal with heat dissipation of electric components (such as a power semiconductor device and a coil) mounted in the circuit board. As such, known power conversion apparatuses adopt a structure in which a circuit board in which electric components are mounted is housed in a casing formed of an aluminum member, and heat generated by the electric components is dissipated through the wall part of the casing. In such known power conversion apparatuses, the wall part of the casing is configured as a baseplate of a heat sink, and heat transmitted to the wall part of the casing is emitted through a fin of the heat sink provided outside the wall part (see, for example, PTL 1).

CITATION LIST

Patent Literature

PTL 1
Japanese Patent Application Laid-Open No. 2017-108007

SUMMARY OF INVENTION

Technical Problem

Inventors of the subject application propose a heat dissipation structure in which, in a power conversion apparatus of a type in PTL 1, an aluminum block is formed on the baseplate of the heat sink (i.e., the wall part of the casing), and heat of electric components (such as a power semiconductor device and a coil) mounted in the circuit board is dissipated through the aluminum block. With such a heat dissipation structure, heat can be effectively dissipated from the electric component, and the electric component can be readily mounted in the casing.

It should be noted that the known power conversion apparatus disclosed in PTL 1 adopts a configuration in which a power semiconductor device is fixed to an aluminum block with a screw. Such a configuration requires a process of soldering the power semiconductor device to the circuit board and the like after the power semiconductor device is fixed to the aluminum block, and consequently the manufacturing process is complicated. In other words, the known power conversion apparatus disclosed in PTL 1 has a room for improvement in the manufacturing process.

In view of the above-mentioned problems, an object of the present disclosure is to provide a power conversion apparatus and a method of manufacturing the power conversion apparatus that can form a heat dissipation structure for heat dissipation of a coil and a power semiconductor device mounted in a circuit board with a simpler manufacturing process.

Solution to Problem

To solve the above-described problems, a power conversion apparatus according to the present disclosure includes a case having a heat-dissipation property, and including a housing part formed to surround a predetermined space, a resin material having a thermal conductivity, the resin material being provided in the predetermined space, a coil disposed in the predetermined space, a coil case having a shape that fits with the housing part, the coil case being configured to house the coil, and a power semiconductor device disposed along a side wall of the coil case. The power semiconductor device is pressed and fixed between a side wall of the housing part and the side wall of the coil case in a state where a heat dissipation surface of the power semiconductor device is in contact with the side wall of the housing part.

In addition, a manufacturing method according to another aspect of the present disclosure is a method of manufacturing the power conversion apparatus, the method including mounting the coil and the power semiconductor device to the circuit board, and relatively moving the circuit board toward the housing part of the heat sink to house the coil inside the housing part and to press and fix the power semiconductor device between the side wall of the housing part and the side wall of the coil case.

Advantageous Effects of Invention

The power conversion apparatus according to the present disclosure can form a heat dissipation structure for heat dissipation of a coil and a power semiconductor device mounted in a circuit board with a simpler manufacturing process.

DESCRIPTION OF EMBODIMENTS

Embodiments of the present disclosure are elaborated below with reference to the drawings. Note that in the specification and drawings, components having substantially the same function are denoted with the same reference numeral to omit redundant descriptions.

Note that in the following description, the upward direction in the drawing is referred to as "upward direction", and the downward direction in the drawing is referred to as "lower direction" for the clarity of the positional relationships of the configurations. It should be noted that these directions do not limit the posture of the power conversion apparatus of embodiments of the present invention when in use.

First Embodiment

Heat Dissipation Structure of Power Conversion Apparatus

An exemplary configuration of a power conversion apparatus according to the present embodiment is described below. The power conversion apparatus according to the present embodiment is applied to a charger that is mounted in a vehicle to charge an in-vehicle battery, for example.

Figure 1:
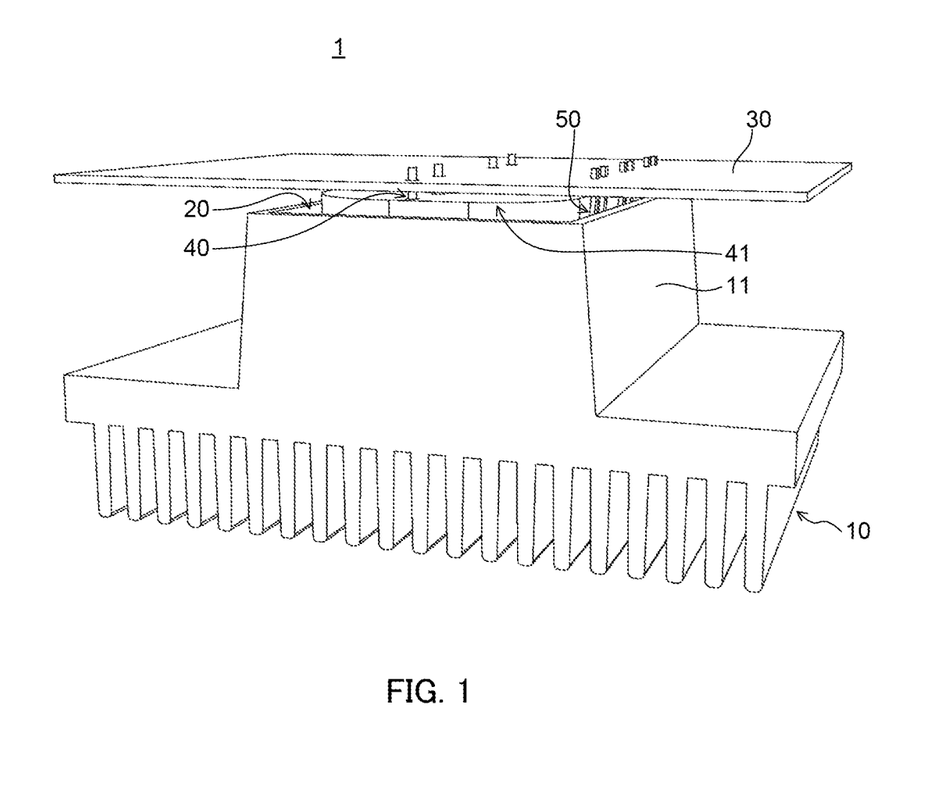
FIG. 1 illustrates a heat dissipation structure of a power conversion apparatus according to a first embodiment.
Figure 2:
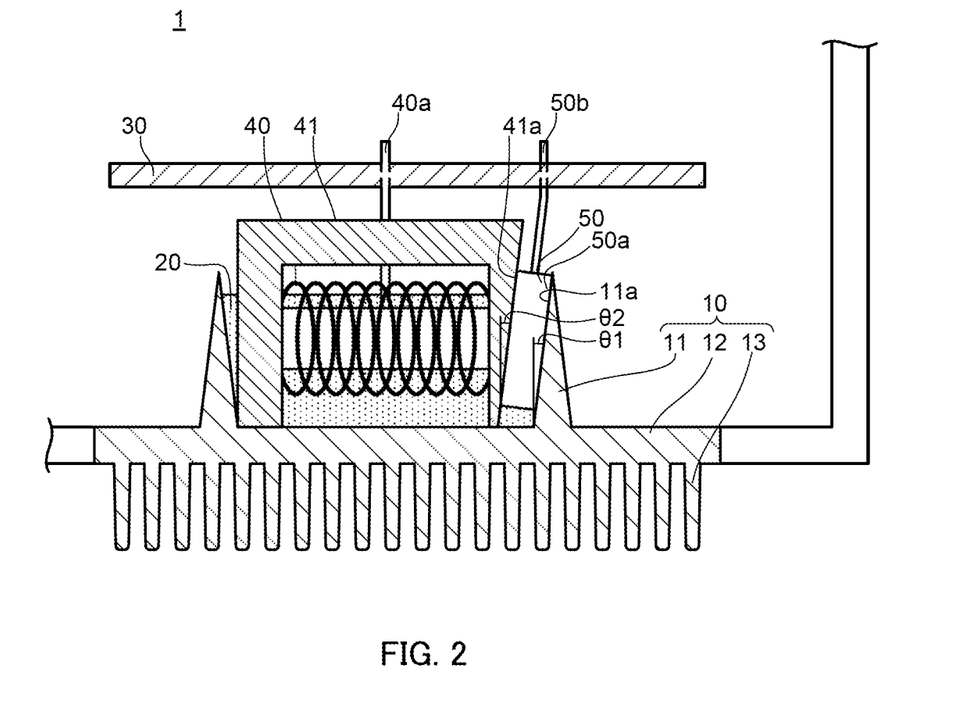
FIG. 2 is a side sectional view illustrating the heat dissipation structure of the power conversion apparatus according to the first embodiment.
Figure 3:
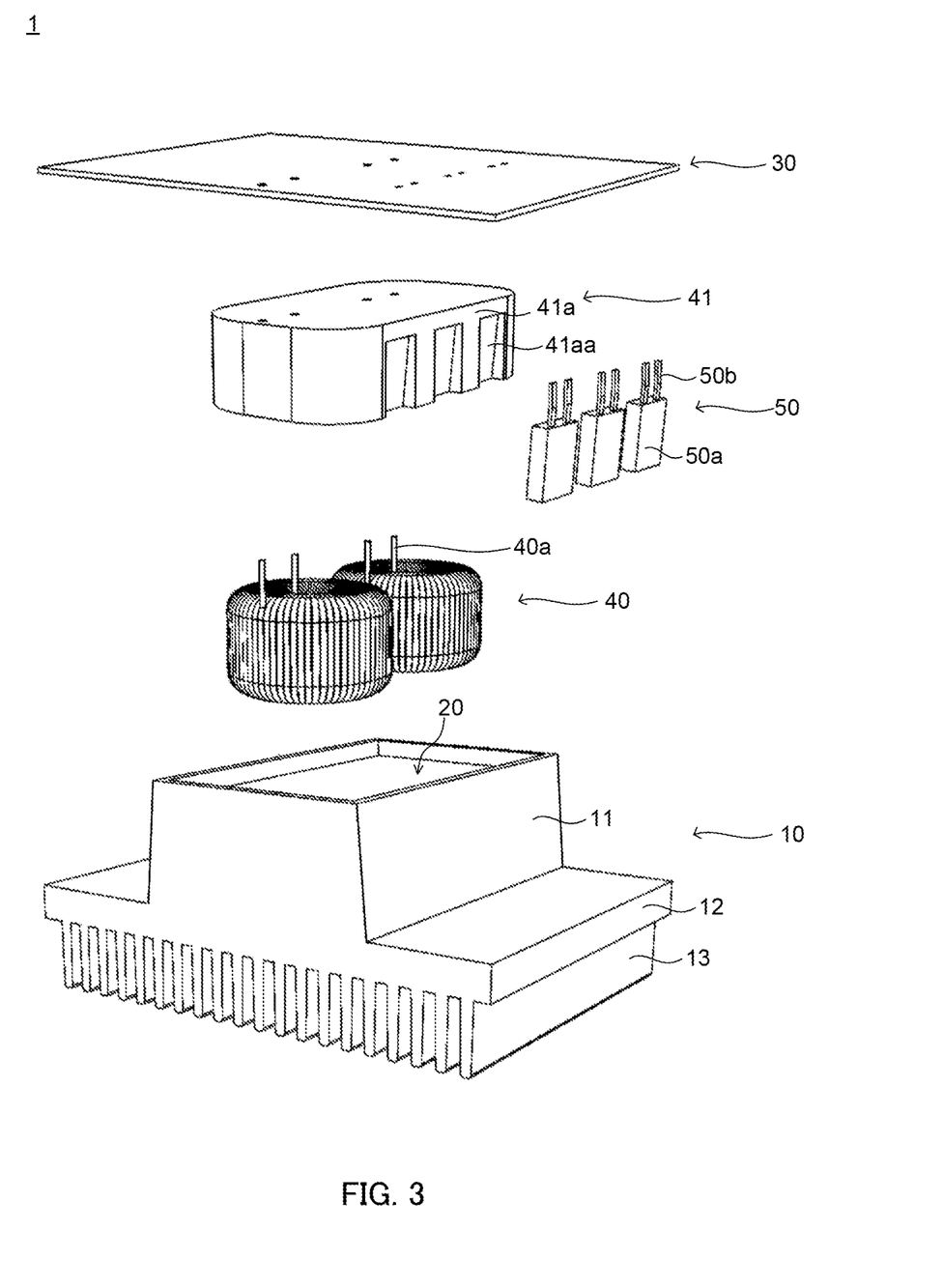
FIG. 3 is an exploded perspective view of the heat dissipation structure of the power conversion apparatus according to the first embodiment.

FIG. 1 illustrates a heat dissipation structure of power conversion apparatus 1 according to the present embodiment. FIG. 2 is a side sectional view of the heat dissipation structure of power conversion apparatus 1 according to the present embodiment. FIG. 3 is an exploded perspective view of the heat dissipation structure of power conversion apparatus 1 according to the present embodiment.

FIGS. 1 and 2 illustrate a state where coil 40 and power semiconductor device 50 of power conversion apparatus 1 are fixed in housing part 11 of heat sink 10. Note that in FIGS. 1 and 3, illustration of the casing of power conversion apparatus 1 is omitted.

Power conversion apparatus 1 includes heat sink 10, resin material 20, circuit board 30, coil 40, coil case 41, and power semiconductor device 50.

Heat sink 10 emits, to the outside of power conversion apparatus 1, heat generated by coil 40 and/or power semiconductor device 50. Heat sink 10 includes, for example, baseplate 12 for supporting circuit board 30, fin 13 protruding downward from baseplate 12, and housing part 11 formed to protrude upward from baseplate 12. Note that in the present embodiment, heat sink 10 is an example of "case" of the embodiments of the present invention.

Note that heat sink 10 is formed integrally with a casing of power conversion apparatus 1, and baseplate 12 forms a wall part of the casing (see FIG. 2), for example. In power conversion apparatus 1, fin 13 of heat sink 10 is disposed in a path of refrigerant (e.g., air refrigerant). Note that the refrigerant is not limited to air refrigerant, and may be liquid refrigerant such as antifreeze liquid.

Housing part 11 is disposed on baseplate 12 to surround a predetermined space on the baseplate 12 (hereinafter referred to as "housing space of housing part 11"). Housing part 11 has a substantially quadrangular hollow prism shape that opens to the upper side, for example. Housing part 11 is formed integrally with baseplate 12 using the same metal member (e.g., aluminum material) as that of baseplate 12, for example.

Note that housing part 11 and baseplate 12 may be composed of separate members. For example, housing part 11 may be joined to baseplate 12 by soldering to baseplate 12.

In the housing space of housing part 11, resin material 20, coil 40, coil case 41, and power semiconductor device 50 are disposed. Here, coil case 41 is fitted in housing part 11. Power semiconductor device 50 is sandwiched between side wall 11a of housing part 11 and side wall 41a of coil case 41, and is pressed and fixed between side wall 11a of housing part 11 and side wall 41a of coil case 41. That is, a part (side wall 11a in FIG. 2) of the side wall of housing part 11 is in contact with power semiconductor device 50 (i.e., heat dissipation surface 50a of power semiconductor device 50).

In housing part 11, side wall 11a that makes contact with power semiconductor device 50 has a shape that is tilted with respect to the normal to the top surface of baseplate 12. More specifically, side wall 11a has a shape that is tilted such that the cross-sectional size of the housing space of housing part 11 increases as it goes upward. This configuration increases the ease of alignment for fitting coil case 41 in housing part 11, and stabilizes the fixed state of power semiconductor device 50.

Resin material 20 is a thermally conductive resin material that fills the housing space of housing part 11. A potting material is used as resin material 20, for example. Note that as resin material 20, it is desirable to use a resin material that has not only thermal conductivity, but also an insulating property.

Resin material 20 is disposed in the state where it is in contact with coil 40, housing part 11 of heat sink 10, and baseplate 12. With this configuration, resin material 20 dissipates heat from coil 40. Specifically, when coil 40 is energized to generate heat, resin material 20 dissipates the heat from coil 40 by transmitting the heat of coil 40 to housing part 11 of heat sink 10 and baseplate 12.

In addition, resin material 20 is also in contact with power semiconductor device 50 to assist heat dissipation from power semiconductor device 50. It should be noted that, the heat dissipation from power semiconductor device 50 is mainly performed through housing part 11 in contact with heat dissipation surface 50a of power semiconductor device 50.

Circuit board 30 is a printed circuit board in which electric components of the circuit of power conversion apparatus 1 are mounted, for example. Coil 40 and power semiconductor device 50 are mounted on the bottom surface side of circuit board 30. More specifically, a through hole is formed in circuit board 30, and coil 40 and power semiconductor device 50 are mounted to circuit board 30 through the through hole. In addition, in circuit board 30, an interconnection pattern (not illustrated) for electrically connecting the electric components mounted in circuit board 30 is formed.

Circuit board 30 is disposed above housing part 11 with a space therebetween, and is supported and fixed with a support base (not illustrated). Note that circuit board 30 is disposed such that the board surface of circuit board 30 is approximately parallel to baseplate 12 of heat sink 10.

Coil 40 is an inductance device used for an internal circuit of a charger, for example. Coil 40 is mounted on the bottom surface side of circuit board 30 to extend downward from circuit board 30, and is thus disposed in the housing space of housing part 11. In the present embodiment, a toroidal coil is used as an example of coil 40.

Coil 40 is a lead member, and leads 40a are provided at one end and the other end of coil 40. Leads 40a of coil 40 are extended upward from the main body part of coil 40 and soldered to circuit board 30.

Coil case 41 is an insulating case that houses coil 40 and sets the shape of coil 40. Coil case 41 has a shape that fits with housing part 11 (more specifically, a shape that fits with housing part 11 in the state where power semiconductor device 50 is fitted in recess 41aa), and is fitted in housing part 11. Note that coil case 41 has a substantially quadrangular hollow prism shape whose lower side is open, for example.

Side wall 41a of coil case 41 includes recess 41aa that fits with power semiconductor device 50 (see FIG. 3). In the state where power semiconductor device 50 is fitted in recess 41aa of coil case 41, power semiconductor device 50 is pressed and fixed between side wall 11a of housing part 11 and side wall 41a of coil case 41.

Here, recess 41aa has a shape tilted in the same direction as the inclination direction of side wall 11a of housing part 11. Note that angle θ2 of recess 41aa with respect to the normal to the board surface of circuit board 30 is substantially equal to angle θ1 of side wall 11a of housing part 11 with respect to the normal to the board surface of circuit board 30, for example (see FIG. 2).

Power semiconductor device 50 is a semiconductor member for power conversion that functions as a switching device in the circuit of power conversion apparatus 1. In the present embodiment, a discrete device such as an insulated gate bipolar transistor (IGBT), metal-oxide-semiconductor field-effect transistor (MOSFET) and a diode is used as an example of power semiconductor device 50.

Power semiconductor device 50 is mounted on the bottom surface side of circuit board 30 to extend downward from the circuit board 30, and is thus disposed along side wall 41a of coil case 41 (in this case, recess 41aa) in the housing space of housing part 11. Power semiconductor device 50 is a DIP member including leads 50b and has a flat shape, for example. Leads 50b of power semiconductor device 50 are connected to circuit board 30 by means of soldering. Note that power semiconductor device 50 includes, at least one side surface thereof, dissipation surface 50a for dissipating heat generated by itself.

Power semiconductor device 50 is fitted in recess 41aa of coil case 41 such that heat dissipation surface 50a is exposed. Thus, in power semiconductor device 50, heat dissipation surface 50a (the right side surface in FIG. 2) is in contact with side wall 11a of housing part 11, and the surface (the left side surface in FIG. 2) on the side opposite to heat dissipation surface 50a is in contact with side wall 41a of coil case 41. Power semiconductor device 50 is pressed and fixed between side wall 11a of housing part 11 and side wall 41a (side wall 41a where recess 41aa is formed) of coil case 41 in the housing space of housing part 11.

In this manner, heat dissipation surface 50a of power semiconductor device 50 is in intimate contact with side wall 11a of housing part 11, and heat generated by power semiconductor device 50 is emitted to heat sink 10 through housing part 11.

Note that power semiconductor device 50 is pressed and fixed by fitting coil case 41 in housing part 11 in the state where power semiconductor device 50 is fitted in recess 41aa of coil case 41 (details are described later).

Note that in the present embodiment, heat sink 10 is described as an example of "case" of the embodiments of the present invention, the present disclosure is not limited to this. Heat sink 10 may be provided separately from the case. Specifically, it is possible to adopt a configuration in which power conversion apparatus 1 includes a case having a heat-dissipation property separately from heat sink 10, and the housing space of the case is filled with resin material 20 so as to dissipate heat of power semiconductor device 50 that is disposed, along the side wall of coil case 41, in contact with the side wall of the housing part of the case.

Manufacturing Process of Power Conversion Apparatus

Next, a manufacturing process of power conversion apparatus 1 is described with reference to FIGS. 4A to 4D. Note that, here, only a manufacturing process for forming a heat dissipation structure of power conversion apparatus 1 is described.

FIGS. 4A to 4D illustrate a manufacturing process of power conversion apparatus 1. FIGS. 4A to 4D illustrate, in a time series order, processes for mounting coil 40 and power semiconductor device 50 on circuit board 30, and attaching the coil 40 and power semiconductor device 50 in the housing space of housing part 11. Note that the series of processes is executed by an automatic assembly apparatus (not illustrated), for example.

Figure 4A:
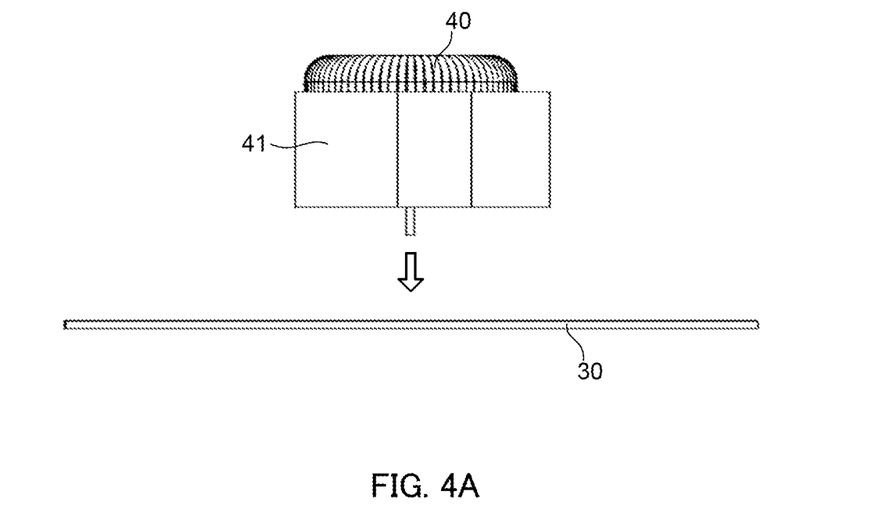
FIG. 4A illustrates a manufacturing process of the power conversion apparatus according to the first embodiment.

First, coil 40 housed in coil case 41 is attached to circuit board 30 (FIG. 4A).

Figure 4B:
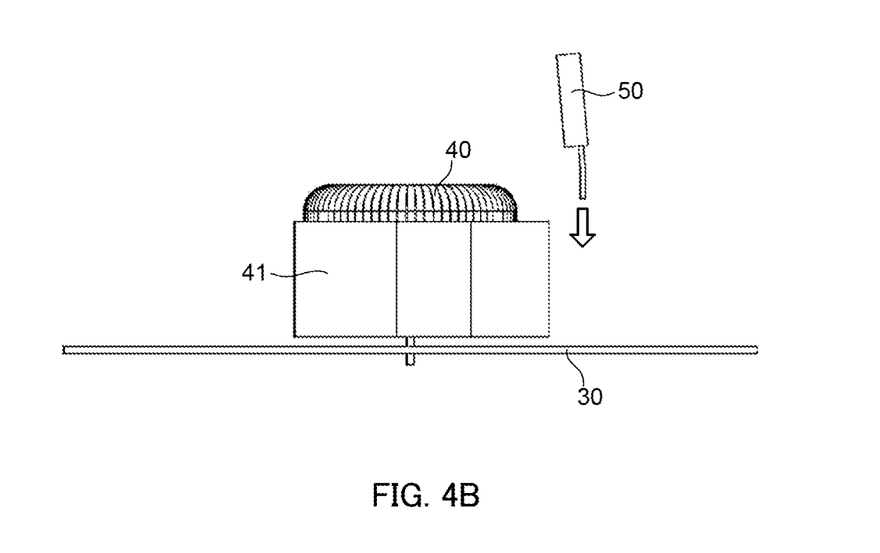
FIG. 4B illustrates a manufacturing process of the power conversion apparatus according to the first embodiment.

Next, power semiconductor device 50 is attached to the surface of circuit board 30 on the side on which coil 40 is attached (FIG. 4B). At this time, power semiconductor device 50 is disposed such that heat dissipation surface 50a faces outward and that power semiconductor device 50 is fitted in recess 41aa of coil case 41. In this manner, power semiconductor device 50 is positioned and locked at recess 41aa of coil case 41.

Then, in this state, Leads 40a of coil 40 and leads 50b of power semiconductor device 50 are soldered to circuit board 30. Note that this soldering process is performed in a dip manner, for example.

Figure 4C:
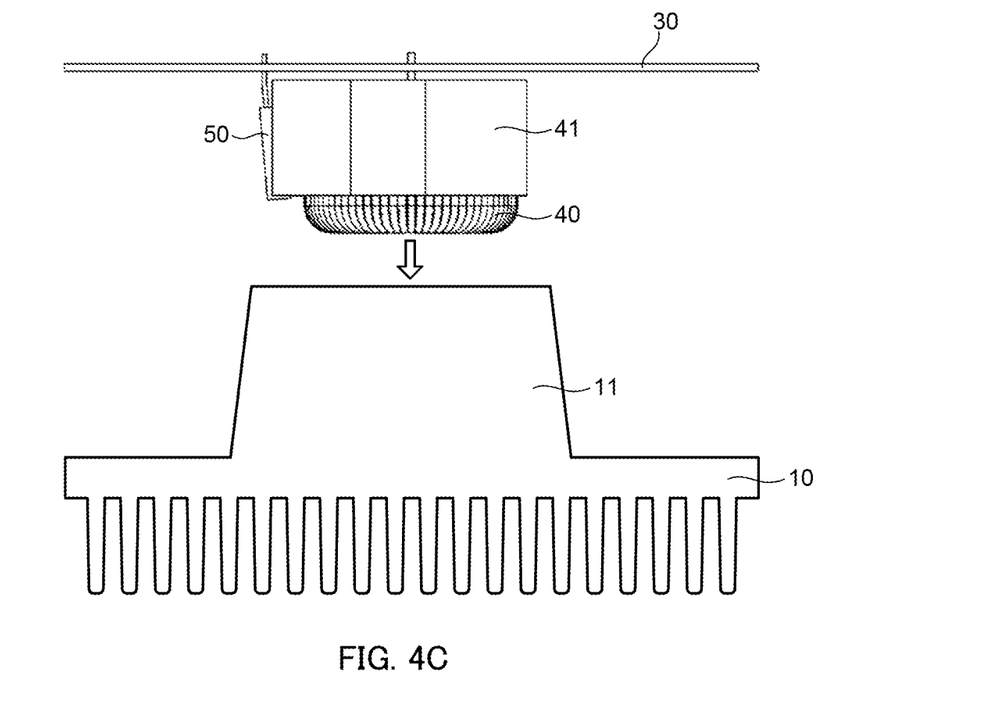
FIG. 4C illustrates a manufacturing process of the power conversion apparatus according to the first embodiment.

Next, circuit board 30 is transported such that coil 40 and power semiconductor device 50 are put in the housing space of housing part 11 (FIG. 4C). Note that this process is performed in the state where the resin material 20 (e.g., a potting material) is uncured after the housing space of housing part 11 is filled with resin material 20, for example.

Figure 4D:
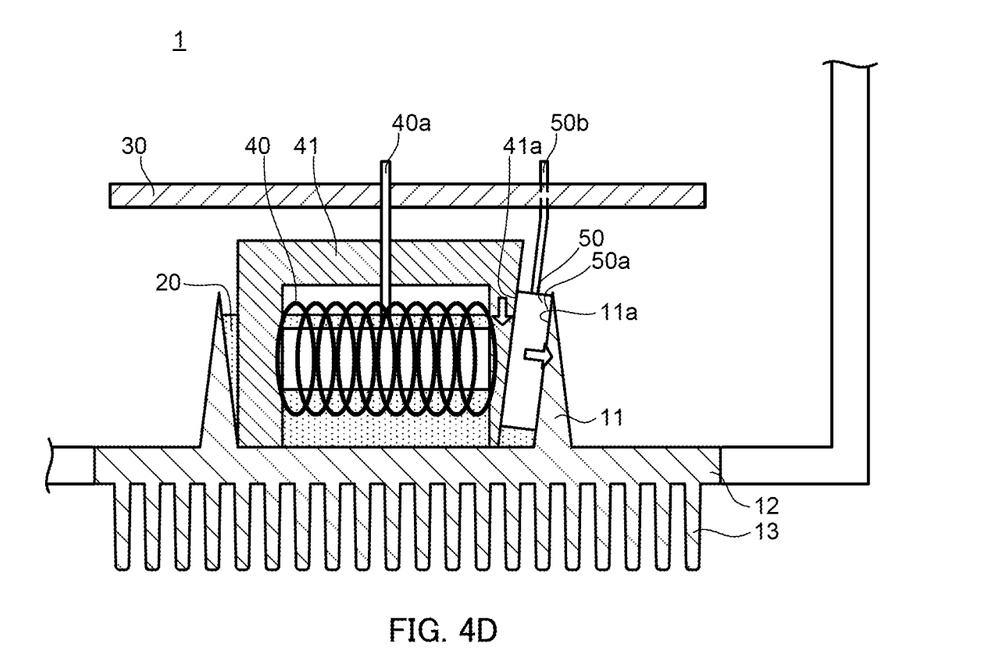
FIG. 4D illustrates a manufacturing process of the power conversion apparatus according to the first embodiment.

Next, circuit board 30 is pushed to a position where coil case 41 is fitted with housing part 11 (FIG. 4D). In this manner, coil case 41 is fitted and fixed in the state where power semiconductor device 50 is sandwiched between side wall 41a of coil case 41 and side wall 11a of housing part 11. As a result, power semiconductor device 50 is pressed and fixed between side wall 41a of coil case 41 and side wall 11a of housing part 11. After this process, resin material 20 is cured with time.

Note that side wall 11a of housing part 11 has a shape that is tilted such that the cross-sectional size of the housing space of housing part 11 increases as it goes upward, and side wall 41a of coil case 41 (in this case, recess 41aa) has a shape tilted in the same direction as the inclination direction of side wall 11a of housing part 11. Accordingly, in the process of FIG. 4D, when coil case 41 is pushed into housing part 11, a lateral stress acts on power semiconductor device 50 from side wall 41a of coil case 41, and power semiconductor device 50 is fixed in the state where its heat dissipation surface 50a is pressed against side wall 11a of housing part 11.

Effect

In this manner, power conversion apparatus 1 according to the present embodiment can achieve, with a simple configuration, stabilization of the fixed state between coil 40 and power semiconductor device 50 and a high heat-dissipation performance of coil 40 and power semiconductor device 50.

In particular, power conversion apparatus 1 according to the present embodiment is advantageous in that the heat dissipation structure for heat dissipation of coil 40 and power semiconductor device 50 can be formed without performing a fixation process using a screw, and that the manufacturing process can be simplified. In addition, this configuration eliminates the need for providing a separate fixing member for fixing coil 40 and power semiconductor device 50, and is therefore advantageous in that the number of components can be reduced and that a space for providing the fixing member can be omitted.

Second Embodiment

Next, power conversion apparatus 1 according to the second embodiment is described with reference to FIG. 5. The heat dissipation structure of power conversion apparatus 1 according to the present embodiment differs from the heat dissipation structure of power conversion apparatus 1 according to the first embodiment in that power semiconductor device 50 is fixed to the outside of the housing space of housing part 11. Note that the description of the same configurations as those of the first embodiment is omitted (the same applies to other embodiments).

Figure 5:
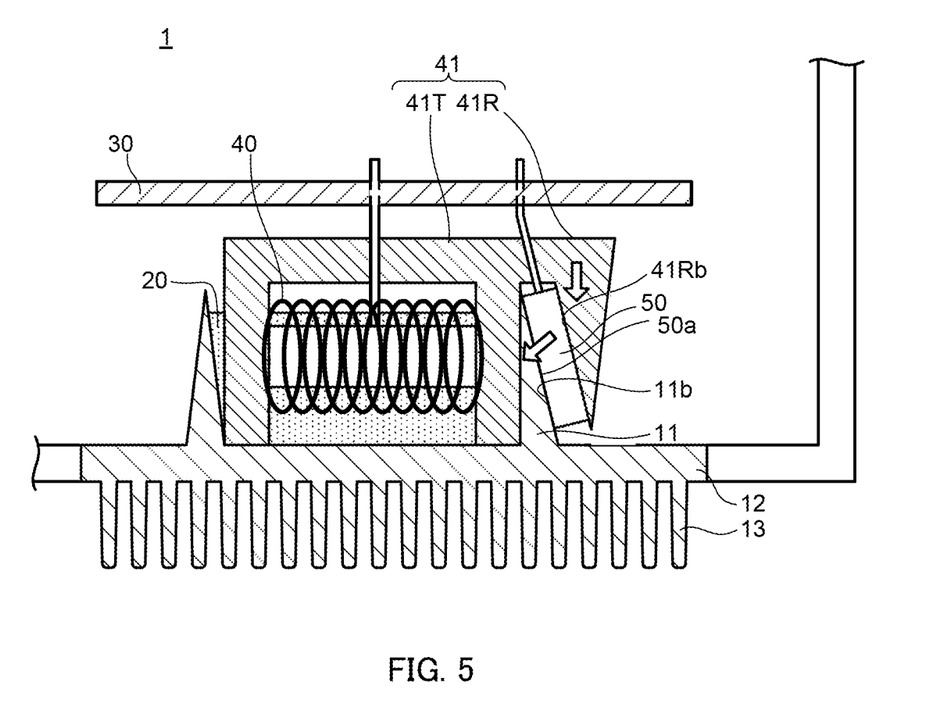
FIG. 5 is a side sectional view illustrating a heat dissipation structure of a power conversion apparatus according to a second embodiment.

FIG. 5 is a side sectional view illustrating a heat dissipation structure of power conversion apparatus 1 according to the second embodiment.

In the present embodiment, power semiconductor device 50 is disposed outside the housing space of housing part 11 such that its heat dissipation surface 50a makes contact with side wall 11b outside the housing space of housing part 11. Power semiconductor device 50 is pressed and fixed between side wall 11b of housing part 11 and side wall 41Rb of extension part 41R of coil case 41 at a location outside the housing space.

Here, coil case 41 according to the present embodiment includes, in addition to main body part 41T that houses coil 40, extension part 41R extending from the main body part 41T to a position facing side wall 11b outside the housing space of housing part 11. Specifically, extension part 41R is formed over housing part 11 to extend from main body part 41T to the outside of the housing space.

Extension part 41R has a shape that fits with a part of housing part 11 when main body part 41T is fitted in the housing space of housing part 11, for example. In other words, extension part 41R has a shape that sandwiches a part of housing part 11 and power semiconductor device 50 between extension part 41R and main body part 41T. When main body part 41T is fitted in the housing space of housing part 11, side wall 41Rb of extension part 41R presses and fixes power semiconductor device 50 to side wall 11b outside the housing space of housing part 11 such that a part of housing part 11 and power semiconductor device 50 are sandwiched between main body part 41T and extension part 41R.

Note that side wall 11b that makes contact with power semiconductor device 50 in housing part 11 has a shape that is tilted with respect to the normal to the top surface of baseplate 12. More specifically, side wall 11b has a shape that is tilted such that as it goes upward, the width of the wall part forming side wall 11b in housing part 11 decreases. With this configuration, when coil case 41 is pushed into housing part 11, a lateral stress acts on power semiconductor device 50 from side wall 41Rb of extension part 41R of coil case 41, and power semiconductor device 50 is fixed in the state where its heat dissipation surface 50a is pressed against side wall 11b of housing part 11 (see the arrow in FIG. 5).

In this manner, power conversion apparatus 1 according to the present embodiment can reduce the area occupied by housing part 11 in the casing. It should be noted that in power conversion apparatus 1 according to the present embodiment, power semiconductor device 50 does not make contact with resin material 20, and therefore the configuration of power conversion apparatus 1 according to the first embodiment is more desirable in terms of the heat-dissipation performance of power semiconductor device 50.

Third Embodiment

Next, power conversion apparatus 1 according to the third embodiment is described with reference to FIG. 6. Power conversion apparatus 1 according to the present embodiment differs from power conversion apparatus 1 according to the second embodiment in that heat sink 10 includes second housing part 11R adjacent to housing part 11.

Figure 6:
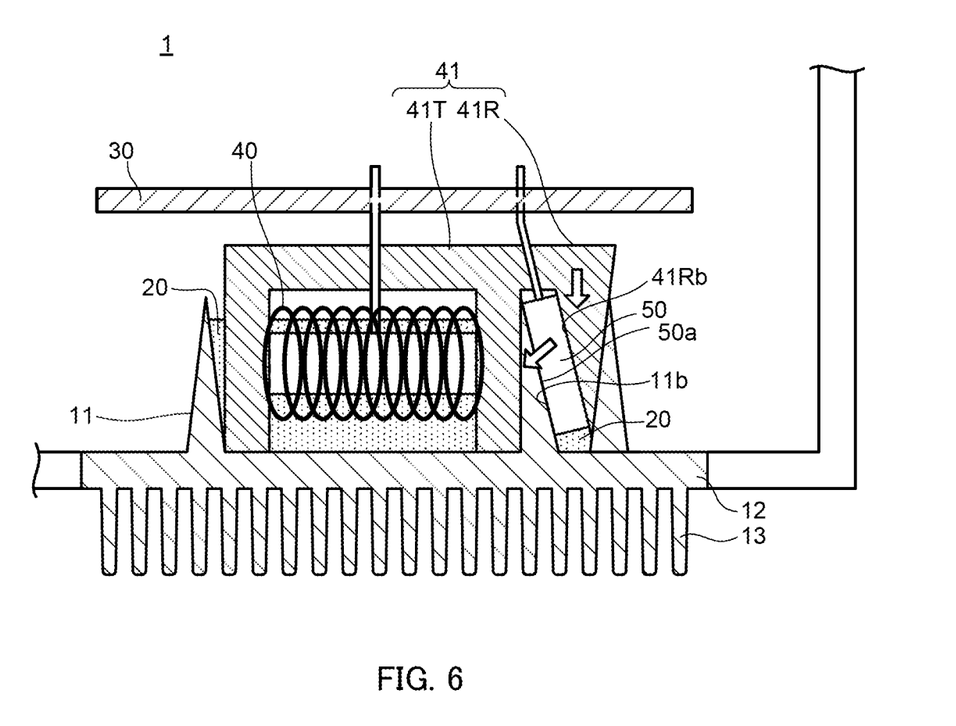
FIG. 6 is a side sectional view illustrating a heat dissipation structure of a power conversion apparatus according to a third embodiment.
Figure 7:
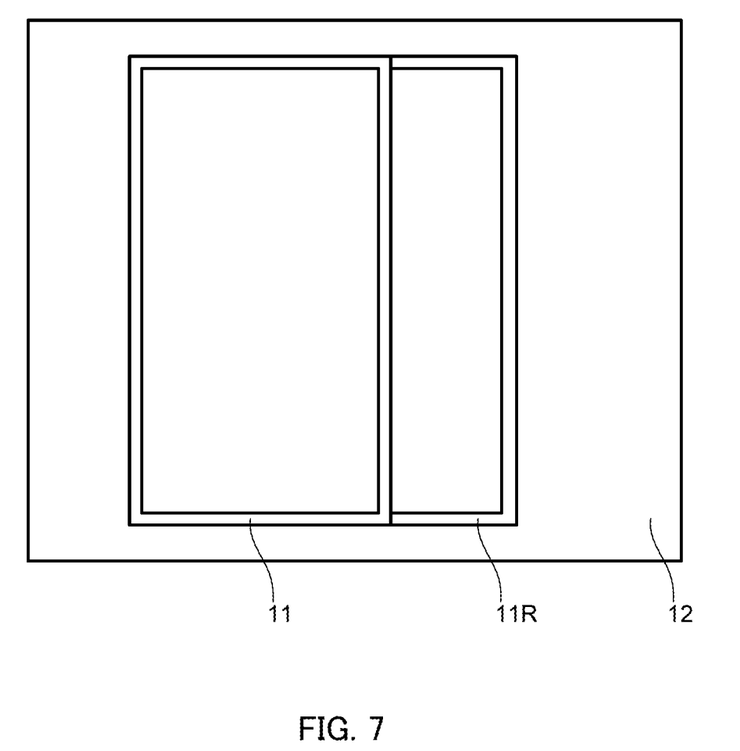
FIG. 7 is a plan view illustrating a configuration of a housing part and a second housing part of the heat dissipation structure of the power conversion apparatus according to the third embodiment.

FIG. 6 is a side sectional view illustrating a heat dissipation structure of power conversion apparatus 1 according to the third embodiment. FIG. 7 is a plan view illustrating a configuration of housing part 11 and second housing part 11R of a heat dissipation structure of power conversion apparatus 1 according to the third embodiment. Note that FIG. 7 illustrates only a configuration of heat sink 10.

Additional housing part 11R is a metal member having a substantially square hollow columnar shape as with housing part 11, for example. Second housing part 11R forms, on baseplate 12, a housing space (hereinafter referred to as "second housing space") that houses an electric component (not illustrated) different from coil 40 at a location adjacent to the housing space (hereinafter referred to as "first housing space") formed by housing part 11. Here, second housing part 11R and housing part 11 share the wall part in-between them.

Resin material 20 is disposed in the second housing space formed with second housing part 11R. In addition, typically, an electric component (e.g., a capacitor) different from coil 40 mounted on circuit board 30 is housed in the second housing space.

In the present embodiment, power semiconductor device 50 is disposed in the second housing space, and is pressed and fixed between side wall 41Rb of extension part 41R of coil case 41 and side wall 11b of housing part 11 in the state where its heat dissipation surface 50a is in contact with side wall 11b of the wall part located between second housing part 11R and housing part 11.

In this manner, according to power conversion apparatus 1 according to the present embodiment, power semiconductor device 50 can be brought into contact with resin material 20, and thus the heat-dissipation performance of power semiconductor device 50 can be improved in comparison with power conversion apparatus 1 according to the second embodiment.

Fourth Embodiment

Next, power conversion apparatus 1 according to the fourth embodiment is described with reference to FIG. 8. Power conversion apparatus 1 according to the present embodiment differs from power conversion apparatus 1 according to the third embodiment in that a biasing force of biasing spring 41Rc is utilized for pressing and fixing power semiconductor device 50 at extension part 41R of coil case 41.

Figure 8:
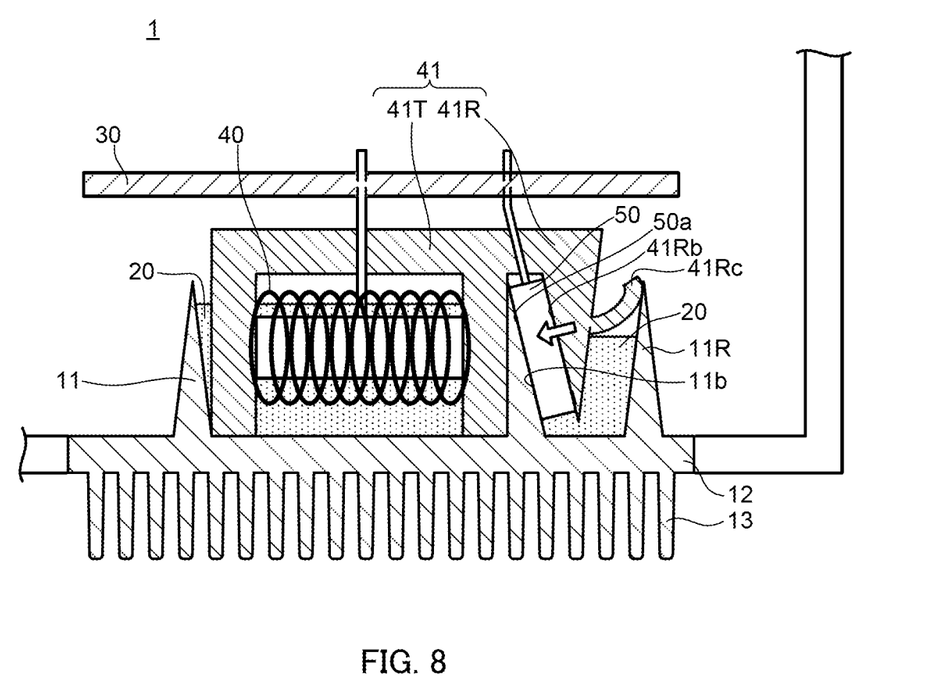
FIG. 8 is a side sectional view illustrating a heat dissipation structure of a power conversion apparatus according to a fourth embodiment.

FIG. 8 is a side sectional view illustrating a heat dissipation structure of power conversion apparatus 1 according to the fourth embodiment.

Extension part 41R of coil case 41 according to the present embodiment includes biasing spring 41Rc at a second surface that is opposite to the first surface of side wall 41Rb for pressing and fixing power semiconductor device 50. Biasing spring 41Rc is disposed at a position that faces side wall 11Rc of second housing part 11R when main body part 41T of coil case 41 is fitted in the first housing space of housing part 11. When main body part 41T of coil case 41 is fitted in the housing space of housing part 11, biasing spring 41Rc makes contact with side wall 11Rc of second housing part 11R so as to bias, with its biasing force, extension part 41R of coil case 41 in the direction of side wall 11b of housing part 11, or in other words, the direction for pressing and fixing power semiconductor device 50.

Note that in the present embodiment, extension part 41R of coil case 41 may have a shape that does not fit with housing part 11. The reason for this is that such a shape can also press and fix power semiconductor device 50 with the biasing force of biasing spring 41Rc.

In this manner, power conversion apparatus 1 according to the present embodiment can stabilize the fixed state of power semiconductor device 50.

Fifth Embodiment

Figure 9:
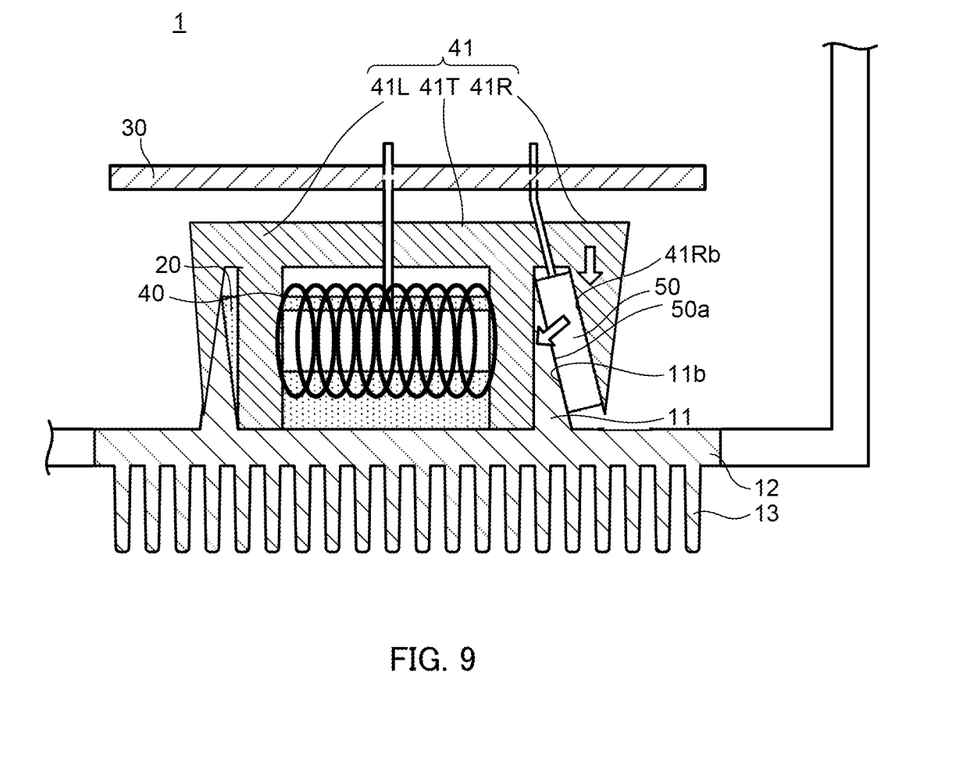
FIG. 9 is a side sectional view illustrating a heat dissipation structure of a power conversion apparatus according to a fifth embodiment.

Next, power conversion apparatus 1 according to the fifth embodiment is described with reference to FIG. 9. Power conversion apparatus 1 according to the present embodiment differs from power conversion apparatus 1 according to the second embodiment in that additional extension part 41L is provided on the side opposite to extension part 41R of coil case 41.

Additional extension part 41L is extended to the side wall outside the housing space of housing part 11 as with extension part 41R. Coil case 41 according to the present embodiment has a structure that fits with housing part 11 such that the side wall on the outside of housing part 11 is sandwiched between extension part 41R and additional extension part 41L.

Note that power conversion apparatus 1 according to the present embodiment has a structure that fits with housing part 11 by using extension part 41R and additional extension part 41L, and therefore main body part 41T of coil case 41 may not have a shape for fitting inside housing part 11.

Other Embodiments

The present invention is not limited to the above-mentioned embodiments, and various modifications may be made.

While toroidal coil 40 is described as an example of coil 40 in the above-mentioned embodiment, coil 40 of any type may be adopted in the present invention. For example, coil 40 may be a coil that constitutes a transformer.

In addition, while a discrete device is described as an example of power semiconductor device 50 in the above-mentioned embodiment, a module member in which a plurality of IGBTs and the like are housed in a single package may be used as power semiconductor device 50.

In addition, a configuration in which circuit board 30 is supported and fixed at the support base provided in the casing of power conversion apparatus 1 is described as an example of the support structure of circuit board 30 in the above-mentioned embodiment. However, the support structure of circuit board 30 is not limited, and may be a structure that is supported and fixed at housing part 11 of heat sink 10.

In addition, the shape including recess 41aa is described as an example of coil case 41 in the above-mentioned embodiment. However, coil case 41 is not limited as long as it has a shape that fits with housing part 11 of heat sink 10, and may have a shape with no recess 41aa. In that case, power semiconductor device 50 may be temporarily joined to side wall 41a of coil case 41 with a bonding material or the like.

In addition, a charger is described as an exemplary application of power conversion apparatus 1 in the above-mentioned embodiment. However, the application of power conversion apparatus 1 of the embodiments of the present invention is not limited, and power conversion apparatus 1 of the embodiments of the present invention may be applied to an inverter, a DCDC converter or the like.

While various embodiments have been described herein above, it is to be appreciated that various changes in form and detail may be made without departing from the spirit and scope of the invention(s) presently or hereafter claimed.

The entire disclosure of Japanese Patent Application No. 2019-224459 filed on Dec. 12, 2019 is incorporated herein by reference in its entirety.

INDUSTRIAL APPLICABILITY

According to the power conversion apparatus according to the embodiments of the present invention, the heat dissipation structure for performing heat dissipation of the power semiconductor device and the coil mounted in the circuit board can be formed through a simpler manufacturing process.

REFERENCE SIGNS LIST

1 Power conversion apparatus
10 Heat sink
11 Housing part
11a, 11b Side wall
11R Second housing part
11Rc Side wall
12 Baseplate
13 Fin
20 Resin material
30 Circuit board
40 Coil
40a Leads
41 Coil case
41a Side wall
41aa Recess
41T Main body part
41R Extension part
41Rb Side wall
41Rc Biasing spring
41L Additional extension part
50 Power semiconductor device 50a Heat dissipation surface
50b Leads

The invention claimed is:

1. A power conversion apparatus comprising:
a case having a heat-dissipation property, and including a housing part formed to surround a predetermined space;
a resin material having a thermal conductivity, the resin material being provided in the predetermined space;
a coil disposed in the predetermined space;
a coil case having a shape that fits with the housing part, the coil case being configured to house the coil; and
a power semiconductor device disposed along a side wall of the coil case,
wherein the power semiconductor device is pressed and fixed between a side wall of the housing part and the side wall of the coil case in a state where a heat dissipation surface of the power semiconductor device is in contact with the side wall of the housing part.

2. The power conversion apparatus according to claim 1, wherein the case is a heat sink including a baseplate and the housing part formed to surround a predetermined space on the baseplate.

3. The power conversion apparatus according to claim 2,
wherein the side wall of the housing part has a shape tilted with respect to a normal to a top surface of the baseplate; and
wherein the side wall of the coil case has a shape tilted in a direction that is identical to an inclination direction of the side wall of the housing part.

4. The power conversion apparatus according to claim 2, wherein the baseplate of the heat sink is a wall part of a casing of the power conversion apparatus.

5. The power conversion apparatus according to claim 1, further comprising a circuit board disposed above the housing part,
wherein the coil is mounted on a bottom surface side of the circuit board; and
wherein the power semiconductor device is mounted on the bottom surface side of the circuit board.

6. The power conversion apparatus according to claim 1, wherein the power semiconductor device is disposed in a recess formed in the side wall of the coil case, the recess being configured to fit with the power semiconductor device.

7. The power conversion apparatus according to claim 1, wherein the power semiconductor device is pressed and fixed between the side wall of the housing part and the side wall of the coil case in the predetermined space in a state where the heat dissipation surface of the power semiconductor device is in contact with the side wall of the housing part.

8. The power conversion apparatus according to claim 1, wherein the power semiconductor device is pressed and fixed between the side wall of the housing part and the side wall of the coil case in a location outside the predetermined space in a state where the heat dissipation surface of the power semiconductor device is in contact with the side wall of the housing part.

9. The power conversion apparatus according to claim 8,
wherein the case includes a second housing part formed to surround a second predetermined space adjacent to the predetermined space, the second housing part being provided at a position adjacent to the housing part; and
wherein the power semiconductor device is disposed inside the second predetermined space filled with the resin material or another resin material having a thermal conductivity.

10. A method of manufacturing the power conversion apparatus according to claim 2, the method comprising:
mounting the coil and the power semiconductor device to a circuit board; and
relatively moving the circuit board toward the housing part of the heat sink to house the coil inside the housing part and to press and fix the power semiconductor device between the side wall of the housing part and the side wall of the coil case.

* * * * *